United States Patent
Bethea et al.

(10) Patent No.: US 6,564,038 B1
(45) Date of Patent: May 13, 2003

(54) METHOD AND APPARATUS FOR SUPPRESSING INTERFERENCE USING ACTIVE SHIELDING TECHNIQUES

(75) Inventors: Clyde George Bethea, Franklin Park, NJ (US); John Philip Franey, Bridgewater, NJ (US); Timothy Lloyd Pernell, East Orange, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/510,780

(22) Filed: Feb. 23, 2000

(51) Int. Cl.$^7$ ................................................ H04B 1/10
(52) U.S. Cl. .................... 455/63; 455/575; 455/90; 455/300; 455/301; 343/702; 343/841
(58) Field of Search .................. 455/575, 90, 300, 455/301, 296, 278.1, 25, 24, 63; 343/702, 841

(56) References Cited

U.S. PATENT DOCUMENTS 3,987,444 A * 10/1976 Masak et al.
4,320,535 A * 3/1982 Brady et al.
5,260,707 A * 11/1993 Goldman

* cited by examiner

*Primary Examiner*—Daniel Hunter
*Assistant Examiner*—Huy D Nguyen
*(74) Attorney, Agent, or Firm*—Ryan, Mason & Lewis, LLP

(57) ABSTRACT

A method and apparatus are disclosed for suppressing interference in a radio frequency (RF) communication system using active shielding techniques. An opposing neutralizing signal is applied to actively neutralize stray signals in a microwave communication environment. An interfering or stray signal is detected using a sensing antenna, and the opposing neutralizing signal is generated in response thereto. The opposing neutralizing signal is applied to a signal neutralizing shield to shield any desired components or devices. The opposing neutralizing signal is approximately 180 degrees out of phase, and of equal magnitude to the detected interfering signal. A phase shifter/null feedback device receives the detected stray signal, if any, and adaptively adjusts the phase and magnitude of the opposing neutralizing signal. In one embodiment, the phase shifter/null feedback device includes an integrator that generates a DC value that is proportional to the energy of the interfering signal. The DC value is applied to a voltage controlled oscillator (VCO) using known feedback techniques to adjust the phase or magnitude, or both, of the opposing neutralizing signal and to thereby minimize the DC value.

17 Claims, 4 Drawing Sheets

METHOD AND APPARATUS FOR SUPPRESSING INTERFERENCE USING ACTIVE SHIELDING TECHNIQUES

FIELD OF THE INVENTION

The present invention relates generally to suppression techniques for electromagnetic interference (EMI) and radio frequency interference (RFI), and, more particularly, to a method and apparatus for suppressing such EMI and RFI using active shielding techniques.

BACKGROUND OF THE INVENTION

Radio frequency communications, including microwave and optical (laser) communications, have many advantages over communications at lower frequencies. Microwave communications, for example, provide a greater diversity of transmissions per frequency, enhanced accuracy and multiplexed users. One significant disadvantage of the high frequencies associated with microwave communications, however, is the ease at which the high frequency signals propagate through small gaps in circuits, cases and shields, creating stray signals.

Thus, the suppression of stray signals in microwave communication devices and other devices that operate in the presence of microwave signals assumes greater significance. A number of techniques have been proposed or suggested for suppressing stray microwave signals. Generally, such suppression techniques attempt to return the stray signals to a common ground, or to attenuate them so that they no longer have a significant amplitude. The most common approach for suppressing EMI is to shield emitting and vulnerable components in "metal cans." See, for example, P. Nyholm et at, "EMI Protection in Consumer Portable Products," Electronic Packaging and Production, 40–44 (March 1994), incorporated by reference herein. Many designs for suppressing stray signals in microwave signal environments have utilized shields comprised of metal springs, clips or mesh. In addition, metal impregnated foam and rubber gasket materials have been utilized as well.

While many of these signal suppression techniques have been effective at lower frequencies, they have not been as effective at the higher frequencies associated with microwave communications. The problems associated with these schemes for microwave communications relate to the propagation of the microwave energy. Specifically, at the frequencies associated with microwave signals, the wavelength is very short. At 2 Gigahertz (GHz), for example, the quarter wavelength is only 1.9 inches. Although the gaps of cases and shields intended to suppress the stray signals are typically on the order of 0.020 inches (0.5 millimeters), the energy can propagate at a direction that is transverse to the gap height. Since the majority of equipment designs are greater than 1.9 inches on a side, this propagation theory will hold true for those specific cases.

In addition, as the frequency increases, the energy associated with the stray signals is more likely to remain on the surface of the shielding device and not penetrate into the bulk of the shielding device. This phenomenon is often referred to as the "skin effect." As a result of the skin effect, all of the stray signals may not be returned to a common ground. It has been observed that above a certain frequency, such shields actually serve to re-emit the stray microwave signals.

Many people are concerned about exposure to electromagnetic radiation, including microwave radiation. In particular, there is a perceived problem regarding potential health risks associated with cellular telephones and other wireless communication devices. Specifically, many individuals are concerned about the potential danger from electromagnetic radiation associated with signals transmitting from the device. To address these concerns, most designs for cellular telephones and other wireless communication devices now incorporate electromagnetic radiation absorbing materials and other shields between the user and the antenna to shield or protect the user from the potentially harmful radiation emitting from the device.

A need therefore exists for an improved method and apparatus for suppressing electromagnetic interference and radio frequency interference in microwave communication systems. A further need exists for a method and apparatus for suppressing such electromagnetic interference and radio frequency interference using active shielding techniques. Yet another need exists for improved method and apparatus for suppressing electromagnetic interference and radio frequency interference in cellular telephones and other wireless communication devices.

SUMMARY OF THE INVENTION

Generally, a method and apparatus are disclosed for suppressing interference in a radio frequency (RF) communication system, including microwave and optical (laser) communication systems, using active shielding techniques. According to one aspect of the invention, an opposing neutralizing signal is applied to actively neutralize stray signals in an RF communication environment. An interfering or stray signal is detected using a sensing antenna, and the opposing neutralizing signal is generated in response thereto. The opposing neutralizing signal is applied to a signal neutralizing shield to shield any desired components or devices. The opposing neutralizing signal is approximately 180 degrees out of phase, and of equal magnitude to the detected interfering signal.

According to another aspect of the invention, a phase shifter/null feedback device receives the detected stray signal, if any, and adaptively adjusts the phase and magnitude of the opposing neutralizing signal. In one embodiment, the phase shifter/null feedback device includes an integrator that generates a DC value that is proportional to the energy of the interfering signal. The DC value is applied to a voltage-controlled oscillator (VCO) using known feedback techniques to adjust the phase or magnitude, or both, of the opposing neutralizing signal and to thereby minimize the DC value.

A more complete understanding of the present invention, as well as further features and advantages of.the present invention, will be obtained by reference to the following detailed description and drawings.

DETAILED DESCRIPTION

Figure 1:
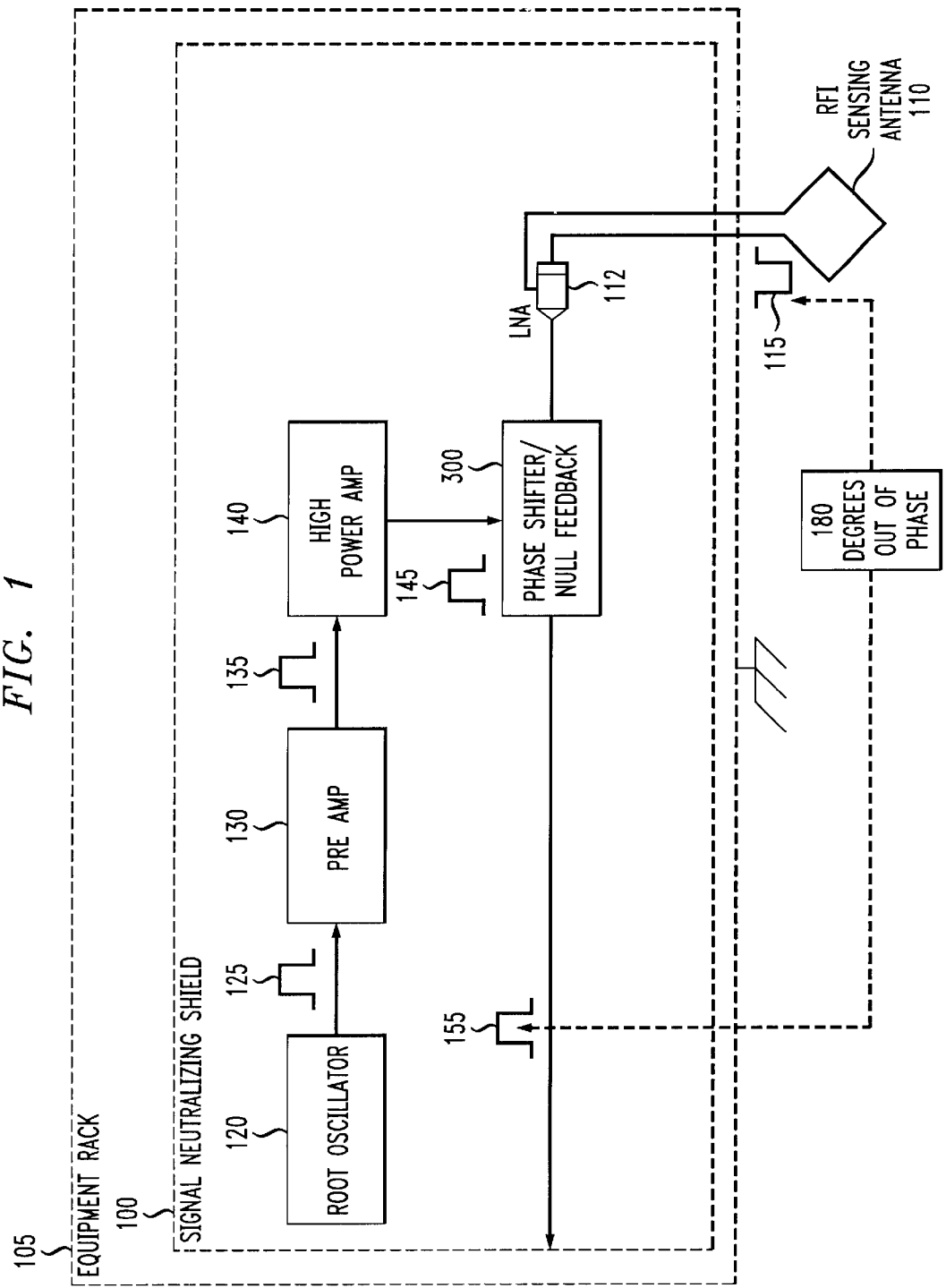
FIG. 1 illustrates a signal neutralizing shield in accordance with one embodiment of the present invention.

FIG. 1 illustrates a signal neutralizing shield 100 in accordance with one embodiment of the present invention.

The signal neutralizing shield 100 serves to shield electronic components and devices mounted in an equipment rack 105. Generally, according to one feature of the present invention, an opposing neutralizing signal is applied to actively neutralize stray signals in an RF communication environment. Thus, as shown in FIG. 1, a radio frequency interference sensing antenna 110 detects any stray signals and an opposing neutralizing signal is applied to the signal neutralizing shield 100. The opposing neutralizing signal is approximately 180 degrees out of phase, and of equal magnitude to any detected stray signals.

Generally, the equipment rack 105 includes a root oscillator 120 that generates a signal to be transmitted. Due to imperfect impedance, some portions of the generated signal will be diverted back to the equipment rack 105 in the form of a stray signal, causing interference. It is an objective of the present invention to reduce the interfering stray signal.

As shown in FIG. 1, the signal neutralizing shield 100 utilizes the root oscillator 120 as a signal source to provide a signal 125. The signal 125 is amplified by a pre-amplifier 130 and a high power amplifier 140. The amplified signal 145, as well as any stray signals 115 detected by the radio frequency interference sensing antenna 110, are applied to a phase shifter/null feedback device 300, discussed further below in conjunction with FIG. 3. It is noted that any stray signals 115 detected by the radio frequency interference sensing antenna 110 are amplified by a low noise amplifier 112 before being applied to the stray signals 115 detected by the radio frequency interference sensing antenna 110.

Generally, the phase shifter/null feedback device 300 receives the detected stray signal 115, if any, and adaptively adjusts the phase and magnitude of the amplified signal source 145 to produce the opposing neutralizing signal 155. It is again noted that any detected stray signals 115 and the corresponding opposing neutralizing signal 155 are approximately 180 degrees out of phase, and of equal magnitude.

Figure 2:
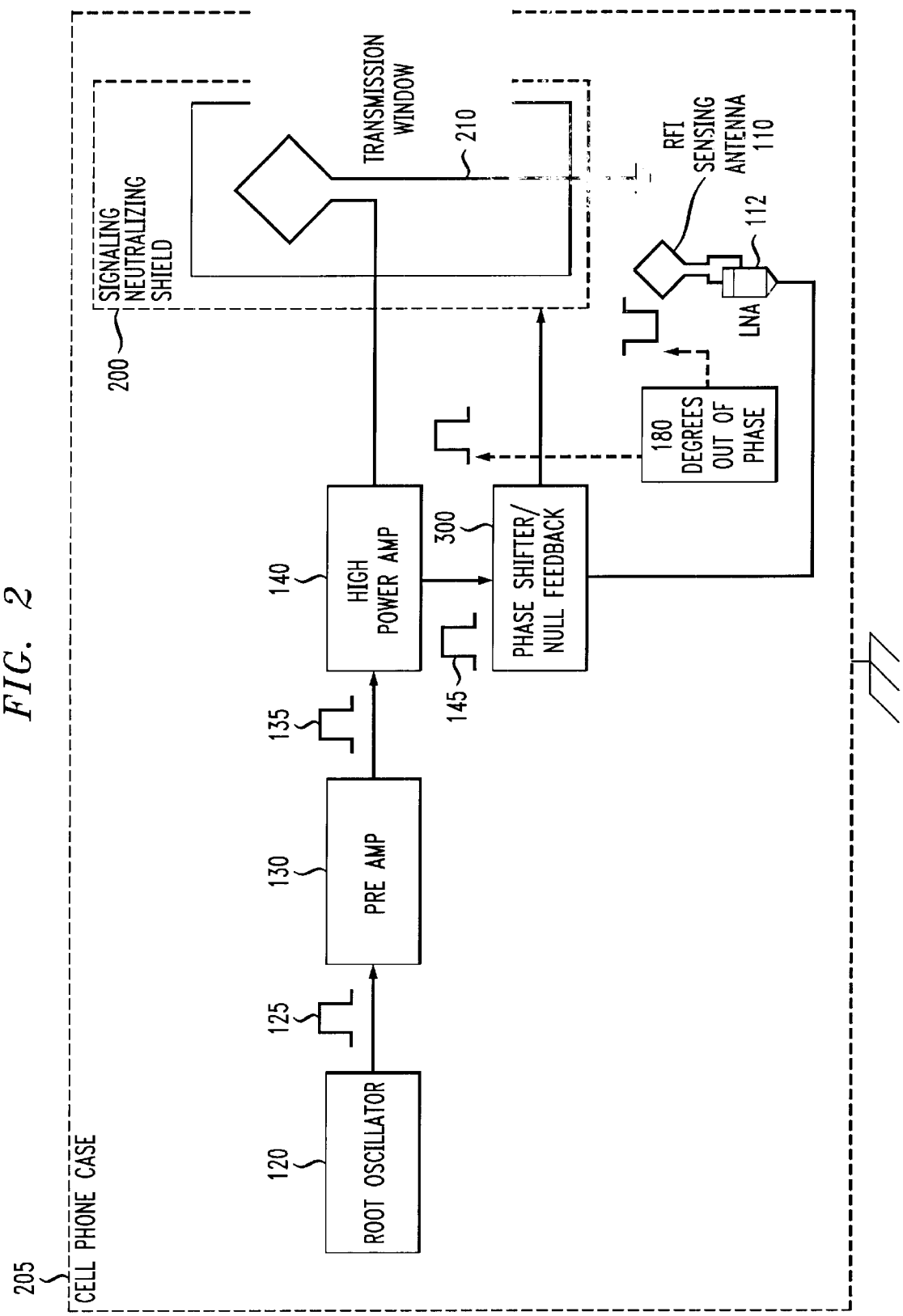
FIG. 2 illustrates a signal neutralizing shield in accordance with a second embodiment of the present invention.

FIG. 2 illustrates a signal neutralizing shield 200 in accordance with another embodiment of the present invention. The signal neutralizing shield 200 serves to shield electronic components and devices mounted in a cell phone 205, as well as to shield the user from the potentially harmful radiation emitting from transmitter 210 of the device 205. Like the signal neutralizing shield 100 of FIG. 1, the signal neutralizing shield 200 for a cell phone implementation includes a radio frequency interference sensing antenna 110 that detects any stray signals and the signal neutralizing shield 200 applies an opposing neutralizing signal that is approximately 180 degrees out of phase, and of equal magnitude to any detected stray signals. The signal neutralizing shield 200 also includes a low noise amplifier 112, root oscillator 120, pre-amplifier 130, high power amplifier 140 and phase shifter/null feedback device 300 that operate in the same manner as described above in conjunction with FIG. 1.

Figure 3:
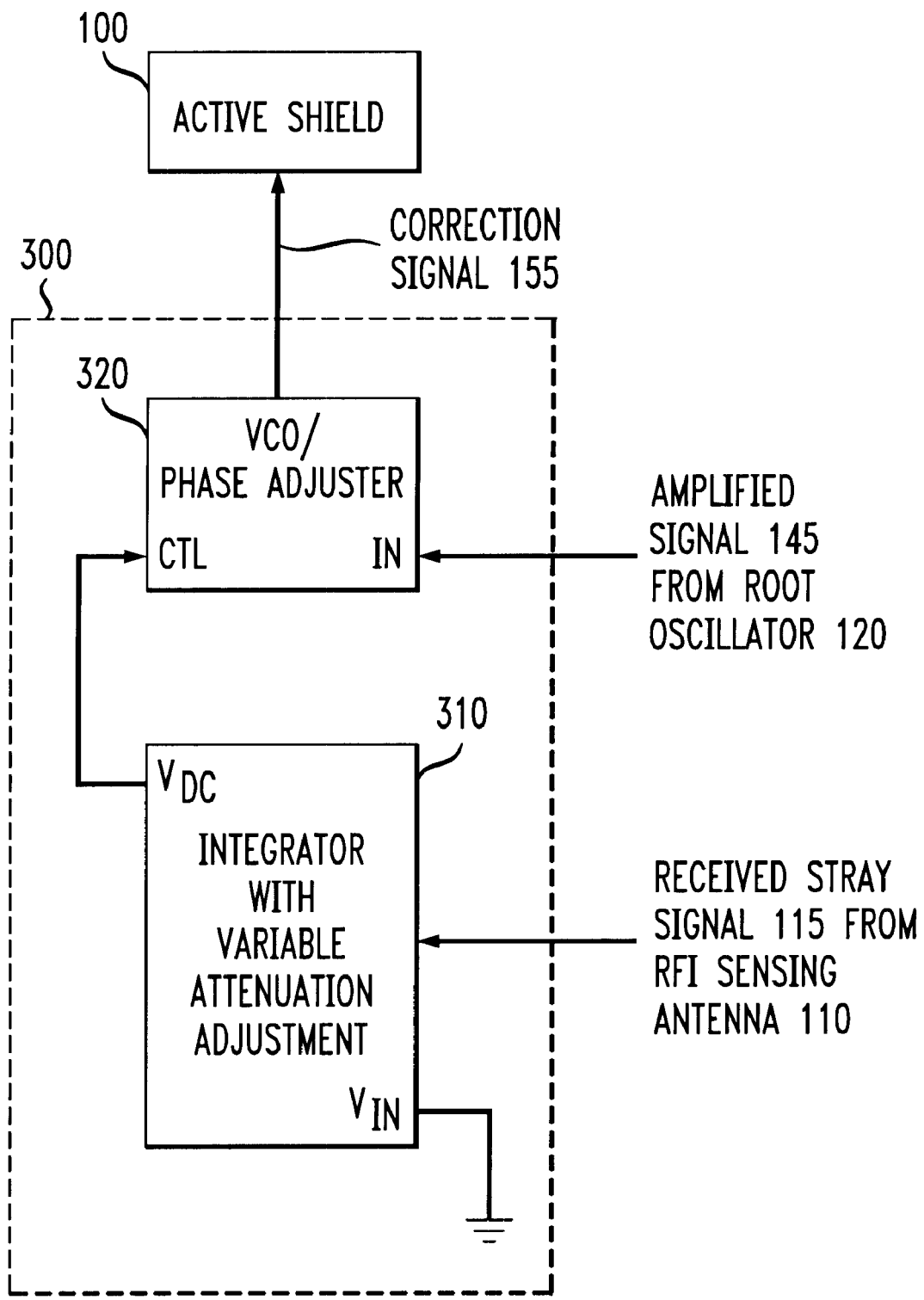
FIG. 3 illustrates the phase shifter/null feedback element of FIGS. 1 and 2.

FIG. 3 illustrates the phase shifter/null feedback element 300 of FIGS. 1 and 2. As shown in FIG. 3, the illustrative phase shifter/null feedback element 300 dynamically adjusts the phase and magnitude of the amplified signal 145 from the root oscillator 120 to generate a signal that is approximately 180 degrees out of phase, and of equal magnitude to the stray signal 115 that is detected by the RFI sensing antenna 110.

The phase shifter/null feedback element 300 includes an integrator 310, discussed further below in conjunction with FIG. 4, that digitally measures the power bands across the frequency spectrum of interest and generates an analog DC level indicating the extent of the interference. Generally, a higher DC level indicates a higher level of interference. As discussed below, the integrator 310 includes a variable attenuator to adjust the magnitude of the generated signal to minimize the DC level, using known feedback techniques. The default magnitude applied by the variable attenuator corresponds to the expected magnitude of the interfering or stray signal 115.

The DC level generated by the integrator 310 is output on pin $V_{DC}$ and is simultaneously applied to a voltage controlled oscillator 320 to adjust the phase of the correction signal 155. As shown in FIG. 3, the VCO 320 generates an oscillator signal using the amplified signal 145 from the root oscillator 120. The VCO 320 will adjust the phase of the generated signal to minimize the DC level, using known feedback techniques. It is noted that the default signal produced by the VCO 320 is 180 degrees out of phase with the signal generated by the root oscillator 120. In a further variation, the phase or magnitude adjustment, or both, may be fixed or predefined if the phase or magnitude of the interfering or stray signal 115 is sufficiently predictable.

Figure 4:
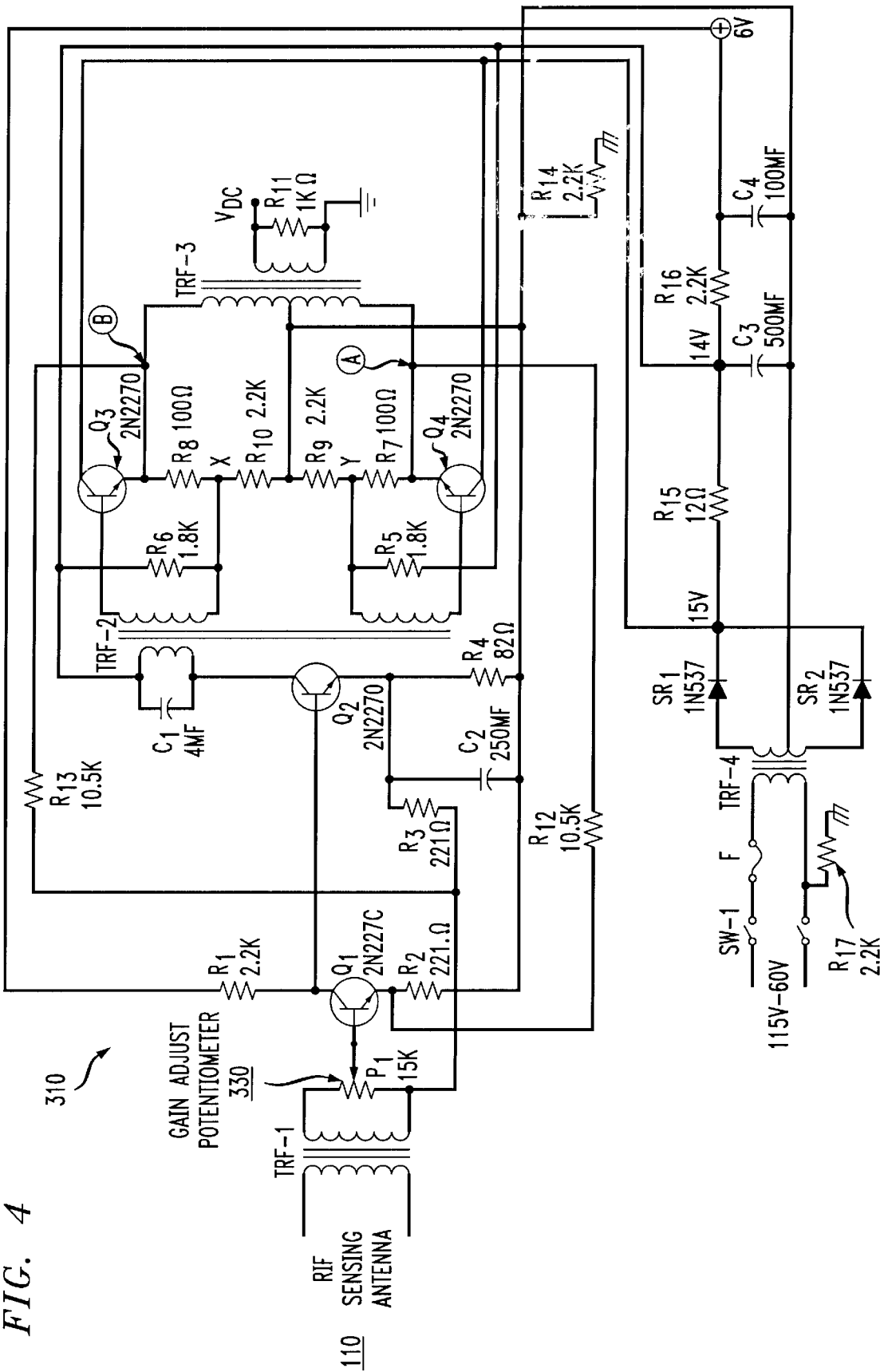
FIG. 4 illustrates an exemplary circuit design for the integrator of FIG. 3.

FIG. 4 illustrates an exemplary circuit design for the integrator 310 of FIG. 3. As shown in FIG. 4, the integrator 310 receives the high-powered spikes associated with the interfering signal 115 from the RFI sensing antenna 110 (FIG. 1) at input TRF-1. For a detailed discussion of the operation of the circuitry shown in FIG. 4, see Source Book of Electronic Circuits, 311 (John Markus ed., McGraw Hill 1968), incorporated by reference herein. Generally, the integrator 310 discriminates, amplifies and integrates all the power in the spikes of the interfering signal 115 within the frequency band of interest. The integrator 310 provides a DC output that corresponds to the interference level seen by the RFI sensing antenna 110. The DC level is output across resistor R11.

As previously indicated, the integrator 310 includes a variable attenuator P1 to adjust the magnitude of the generated signal and thereby minimize the DC level, using known feedback techniques. The default magnitude applied by the variable attenuator corresponds to the expected magnitude of the interfering or stray signal 115.

It is to be understood that the embodiments and variations shown and described herein are merely illustrative of the principles of this invention and that various modifications may be implemented by those skilled in the art without departing from the scope and spirit of the invention.

We claim:

1. An interference suppression device, comprising:
   a sensing antenna for detecting an interfering signal;
   a signal source for generating a correction signal that opposes said interfering signal; and
   a shield for conducting said correction signal to actively neutralize said interfering signal.

2. The interference suppression device of claim 1, wherein said correction signal is approximately 180 degrees out of phase, and of equal magnitude to said interfering signal.

3. The interference suppression device of claim 1, wherein said signal source includes an oscillator generating a signal having a phase, and an integrator that produces a DC level corresponding to said interfering signal, and wherein said DC level is applied in a feedback arrangement to adjust said phase.

4. The interference suppression device of claim 1, wherein said signal source includes an oscillator generating a signal having a magnitude, and an integrator that produces a DC level corresponding to said interfering signal, and wherein said DC level is applied in a feedback arrangement to adjust said magnitude.

5. The interference suppression device of claim 1, wherein said interference suppression device is employed in an equipment rack and wherein said signal source utilizes an oscillator on said equipment rack to generate said correction signal.

6. The interference suppression device of claim 1, wherein said interference suppression device is employed in a wireless telephone and wherein said signal source utilizes an oscillator on said wireless telephone to generate said correction signal.

7. The interference suppression device of claim 1, wherein said interference suppression device is employed in a wireless telephone and wherein said correction signal shields components in said wireless telephone and shields a user from said interfering signal.

8. An interference suppression device, comprising:
   a sensing antenna for detecting an interfering signal;
   a signal source for generating a correction signal that is approximately 180 degrees out of phase and of approximately equal magnitude to said interfering signal; and
   a shield for conducting said correction signal.

9. The interference suppression device of claim 8, wherein said signal source includes an oscillator generating a signal having a phase, and an integrator that produces a DC level corresponding to said interfering signal, and wherein said DC level is applied in a feedback arrangement to adjust said phase.

10. The interference suppression device of claim 8, wherein said signal source includes an oscillator generating a signal having a magnitude, and an integrator that produces a DC level corresponding to said interfering signal, and wherein said DC level is applied in a feedback arrangement to adjust said magnitude.

11. The interference suppression device of claim 8, wherein said interference suppression device is employed in an equipment rack and wherein said signal source utilizes an oscillator on said equipment rack to generate said correction signal.

12. The interference suppression device of claim 8, wherein said interference suppression device is employed in a wireless telephone and wherein said signal source utilizes an oscillator on said wireless telephone to generate said correction signal.

13. The interference suppression device of claim 8, wherein said interference suppression device is employed in a wireless telephone and wherein said correction signal shields components in said wireless telephone and shields a user from said interfering signal.

14. A method for suppressing interference in an electronic device, comprising the steps of:
   detecting an interfering signal;
   generating a correction signal that opposes said interfering signal; and applying said correction signal to a shield to actively neutralize said interfering signal.

15. The method of claim 14, wherein said correction signal is approximately 180 degrees out of phase, and of equal magnitude to said interfering signal.

16. The method of claim 14, wherein said generating step further comprises the steps of producing a signal having a phase, and producing a DC level corresponding to said interfering signal, and applying said DC level in a feedback arrangement to adjust said phase.

17. The method of claim 14, wherein said generating step further comprises the steps of producing a signal having a magnitude, and producing a DC level corresponding to said interfering signal, and applying said DC level in a feedback arrangement to adjust said magnitude.

* * * * *